(12) United States Patent
Muller

(10) Patent No.: US 7,126,326 B2
(45) Date of Patent: Oct. 24, 2006

(54) SEMICONDUCTOR DEVICE TESTING APPARATUS, SEMICONDUCTOR DEVICE TESTING SYSTEM, AND SEMICONDUCTOR DEVICE TESTING METHOD FOR MEASURING AND TRIMMING THE OUTPUT IMPEDANCE OF DRIVER DEVICES

(75) Inventor: Georg Muller, Munich (DE)

(73) Assignee: Infineon Technologies AG, Munich (DE)

( * ) Notice: Subject to any disclaimer, the term of this patent is extended or adjusted under 35 U.S.C. 154(b) by 16 days.

(21) Appl. No.: 10/663,448

(22) Filed: Sep. 16, 2003

(65) Prior Publication Data

US 2004/0124859 A1 Jul. 1, 2004

(30) Foreign Application Priority Data

Sep. 19, 2002 (DE) .............................. 102 43 603

(51) Int. Cl.
*G01R 31/02* (2006.01)
*G01R 31/26* (2006.01)

(52) U.S. Cl. .................... 324/158.1; 324/713; 327/112

(58) Field of Classification Search ............... 324/713, 324/750–765, 158.1; 327/112
See application file for complete search history.

(56) References Cited

U.S. PATENT DOCUMENTS

| | | | |
|---|---|---|---|
| 5,338,987 A * | 8/1994 | Tomasetti et al. ........... 327/108 |
| 5,438,545 A * | 8/1995 | Sim ....................... 365/189.05 |
| 6,115,298 A | 9/2000 | Kwon et al. ................. 365/198 |
| 6,281,719 B1 * | 8/2001 | Ho et al. ..................... 327/108 |
| 6,400,177 B1 * | 6/2002 | Yoshizaki ..................... 326/30 |
| 6,541,996 B1 * | 4/2003 | Rosefield et al. ............. 326/30 |
| 6,693,447 B1 * | 2/2004 | Savignac et al. ........... 324/765 |
| 6,751,782 B1 * | 6/2004 | Levin et al. ................... 716/1 |
| 2003/0025535 A1 * | 2/2003 | Raychaudhuri ............. 327/108 |

FOREIGN PATENT DOCUMENTS

DE    690 19 621 T2    7/1990

* cited by examiner

*Primary Examiner*—Ha Tran Nguyen
*Assistant Examiner*—Emily Y Chan
(74) *Attorney, Agent, or Firm*—Arendt & Associates Intellectual Property Group; Jacqueline M. Arendt

(57) ABSTRACT

The disclosure relates to a semiconductor device testing apparatus, a semiconductor device testing system, and a semiconductor device testing method, in particular a method for measuring or trimming, respectively, the impedance of driver devices provided in a semiconductor device, wherein a device, in particular a driver device, comprising each a pull-up circuit and a pull-down circuit is used, and wherein the method includes: joint activating of both the pull-up circuit and the pull-down circuit; and determining a first current flowing through the pull-up circuit or the pull-down circuit, respectively, with jointly activated pull-up and pull-down circuits.

12 Claims, 2 Drawing Sheets

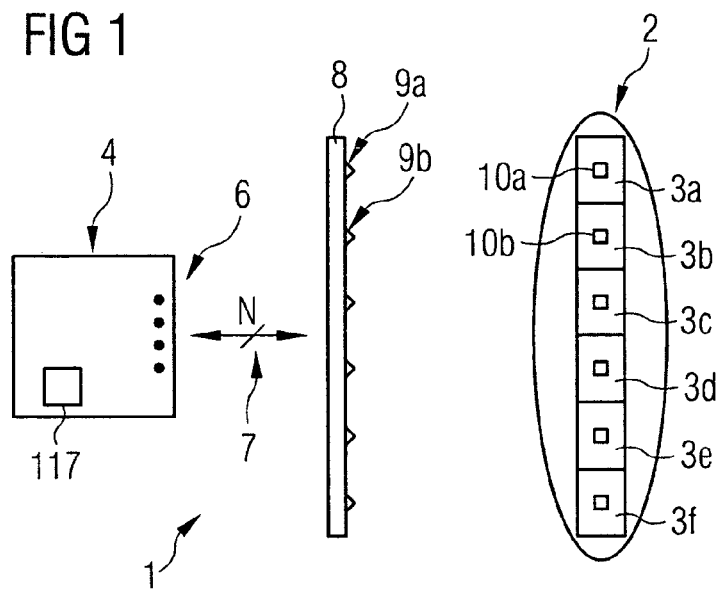
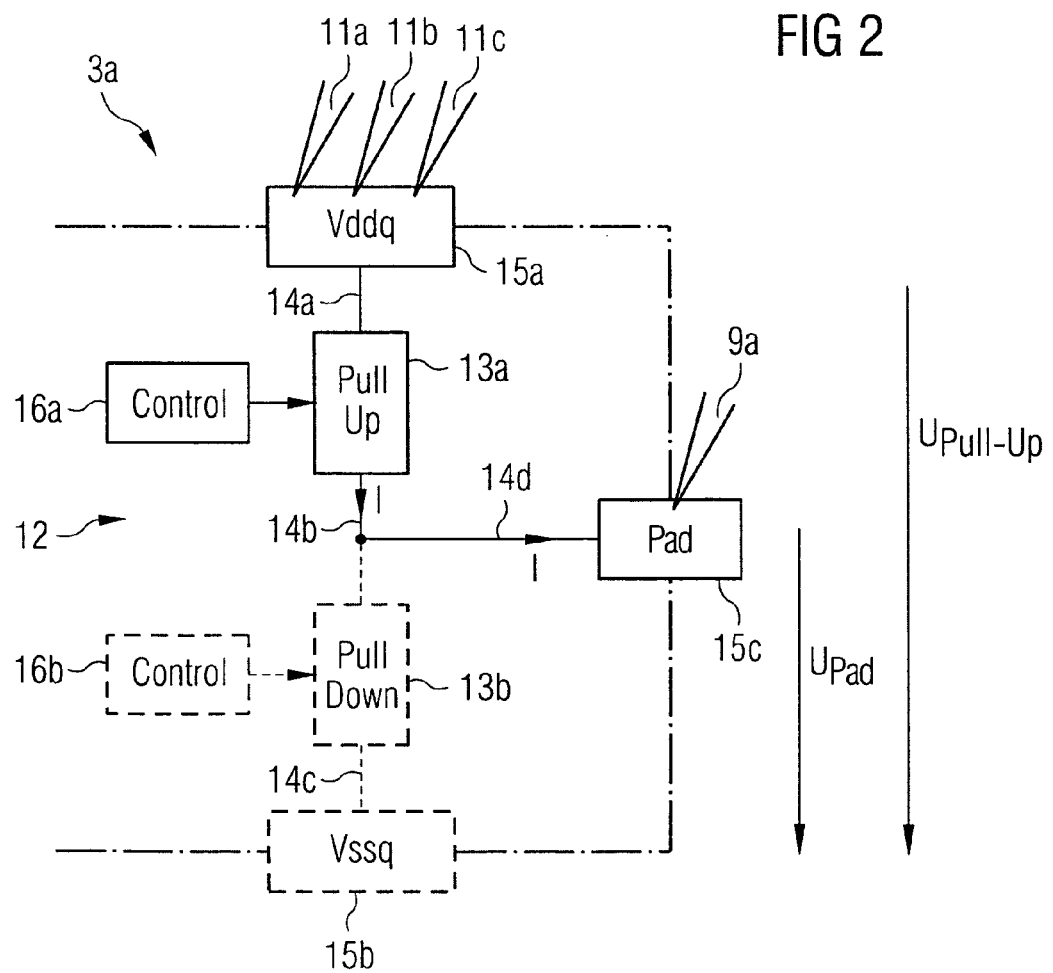

SEMICONDUCTOR DEVICE TESTING APPARATUS, SEMICONDUCTOR DEVICE TESTING SYSTEM, AND SEMICONDUCTOR DEVICE TESTING METHOD FOR MEASURING AND TRIMMING THE OUTPUT IMPEDANCE OF DRIVER DEVICES

FIELD OF THE INVENTION

The disclosure relates to a semiconductor device testing apparatus, a semiconductor device testing system, and a semiconductor device testing method, in particular a method for measuring or trimming, respectively, the impedance of driver devices provided in a semiconductor device.

BACKGROUND SECTION

Semiconductor devices, e.g. appropriate, integrated (analog or digital) computing circuits, semiconductor memory devices such as functional memory devices (PLAs, PALs, etc.) and table memory devices (e.g. ROMs or RAMs, in particular SRAMs and DRAMs), etc. are subject to comprehensive tests e.g. in the finished and/or semifinished state.

In the scope of such kind of test, for instance with particular DRAMs (Dynamic Random Access Memories or dynamic read-write memories, respectively), in particular with DDR DRAMs (Double Data Rate DRAMs), the output impedance of the driver devices provided in the chip or semiconductor device, respectively, may be adapted to the impedance of the signal lines.

Every driver device may e.g. comprise a pull-up and a pull-down circuit being connected in series.

The pull-up circuit is e.g. connected to the supply voltage, and the pull-down circuit is connected to the ground.

For outputting a "logic One" (during the regular operation of the semiconductor device), the pull-up circuit may be switched on, i.e. be put in a conductive state, and the pull-down circuit may be switched off, i.e. be put in a locked state—then, a "logically high" output signal will be output at an output pad connected between the pull-up and the pull-down circuits.

Correspondingly, for outputting a "logic 0"—during the regular operation of the semiconductor device—, the pull-up circuit is switched off, i.e. put in a locked state, and the pull-down circuit is switched on, i.e. put in a conductive state, so that, correspondingly, a "logically low" output signal is output at the output pad.

The pull-up and the pull-down circuits may e.g. each comprise a plurality of transistors connected in parallel (e.g. the pull-up circuit a plurality of p-channel MOSFETs and the pull-down circuit a plurality of n-channel MOSFETs).

The output impedance of the driver devices provided in the chip or in the semiconductor device, respectively, may be adapted during the testing operation of the semiconductor device (i.e. in the scope of an appropriate testing method) to the impedance of the signal lines for instance by the fact that, by means of a so-called laser fuse method from chip to chip (e.g. from driver device to driver device), a different number of transistors in the respective driver devices is put to the "enabled" state (i.e. is later on, during the regular operation of the semiconductor device, used for driving signals), or is left in a "non-enabled" state (i.e. is later on, during the regular operation of the semiconductor device, not used for driving signals).

In order to determine how many (or which) transistors are to be put in an "enabled" state by means of the laser fuse method, and how many (or which) transistors are to be left in a "non-enabled" state (so-called "driver setting"), the pull-up circuit may first of all be switched on and the pull-down circuit may be switched off (then, a "logically high" output signal level is driven by the driver device).

Subsequently, a reference voltage is applied to the above-mentioned output pad—e.g. by means of a corresponding signal needle—, and the current flowing from the supply voltage via the pull-up circuit to the output pad is then measured for all possible driver settings.

From the current measured, the respectively applicable output impedance of the pull-up circuit may be determined for the respective driver setting in a manner known per se (and thus that driver setting may be selected at which the output impedance of the pull-up circuit corresponds—as precisely as possible—to the desired pull-up circuit output impedance).

Subsequently (correspondingly vice versa), the pull-up circuit may be switched off and the pull-down circuit may be switched on (so that a "logically low" output signal level is then driven by the driver device), and—again for all possible driver settings—the current then flowing from the output pad via the pull-down circuit to the ground may be measured.

From the current measured, the respectively applicable output impedance of the pull-down circuit may then be determined for the respective driver setting in a manner known per se (and thus that driver setting may be selected at which the output impedance of the pull-down circuit corresponds—as precisely as possible—to the desired pull-down circuit output impedance (wherein this should be as identical as possible to the above-mentioned pull-up circuit impedance)).

In the case of this trimming method, however, the problem arises that—depending on the degree of dirtying of the signal needle used for measurement, via which, as explained above, a (reference) voltage is applied to the output pad—the signal needle contact resistance may vary strongly.

The respective signal needle contact resistance influences—in a way difficult to predict—the current flowing through the output pad (and thus—in a way difficult to predict—the respective value determined for the output impedance).

Therefore, with the above-described method, the output impedance can be set with relatively small accuracy only.

SUMMARY OF THE INVENTION

A semiconductor device testing apparatus, a novel semiconductor device testing system, a novel semiconductor device, and a novel semiconductor device testing method, in particular a novel method for measuring or trimming, respectively, the impedance of driver devices provided in a semiconductor device.

In accordance with a basic idea of the invention, a method for measuring or trimming, respectively, the impedance of driver devices provided in a semiconductor device is provided, wherein a device comprising a pull-up circuit and a pull-down circuit, in particular a driver device, is used, and wherein the method comprises the following steps:

joint activating of both the pull-up circuit and the pull-down circuit; and determining of the current ($I_{total,corr}$) flowing through the pull-up circuit or the pull-down circuit, respectively, with—jointly—activated pull-up and pull-down circuits.

Advantageously, the method additionally comprises the following step:

determining of the voltage ($U_{output}$) available at the pull-up circuit or the pull-down circuit, respectively (or an output pad, respectively) with—jointly—activated pull-up and pull-down circuits.

It is of particular advantage when the above-mentioned method steps are performed several times in sequence—always with different settings of transistors comprised in the pull-up or pull-down circuit, respectively.

From the respective voltage ($U_{output}$) determined for the corresponding settings, and from the respective current ($I_{total,\ corr}$) determined for the corresponding settings, that driver setting may be determined at which the output impedance of the pull-up and pull-down circuits corresponds—as precisely as possible—to the desired pull-up and pull-down circuit output impedance, as will be explained in detail further below.

Since the above-mentioned voltage ($U_{output}$) can be measured current-free (or almost current-free), the measuring result is not (or only slightly) influenced by an—uncontrollably strong—dirtying of a signal needle used for measuring the above-mentioned voltage ($U_{output}$) and contacting the output pad.

Therefore, by means of the method according to the invention, the output impedance of the respective driver devices may be set with higher accuracy than is the case in prior art.

BRIEF DESCRIPTION OF THE DRAWINGS

In the following, the invention will be explained in detail by means of embodiments and the enclosed drawing. The drawing shows:

FIG. 1 a schematic representation of the basic structure of a semiconductor testing system used with the present invention;

FIG. 2 a schematic detail representation of a portion of a semiconductor device to be tested as illustrated in FIG. 1, as well as of contact needles which are arranged or designed such that a method for measuring and trimming the output impedance of semiconductor device driver apparatuses in accordance with prior art can be performed.

DETAILED DESCRIPTION

Figure 3:
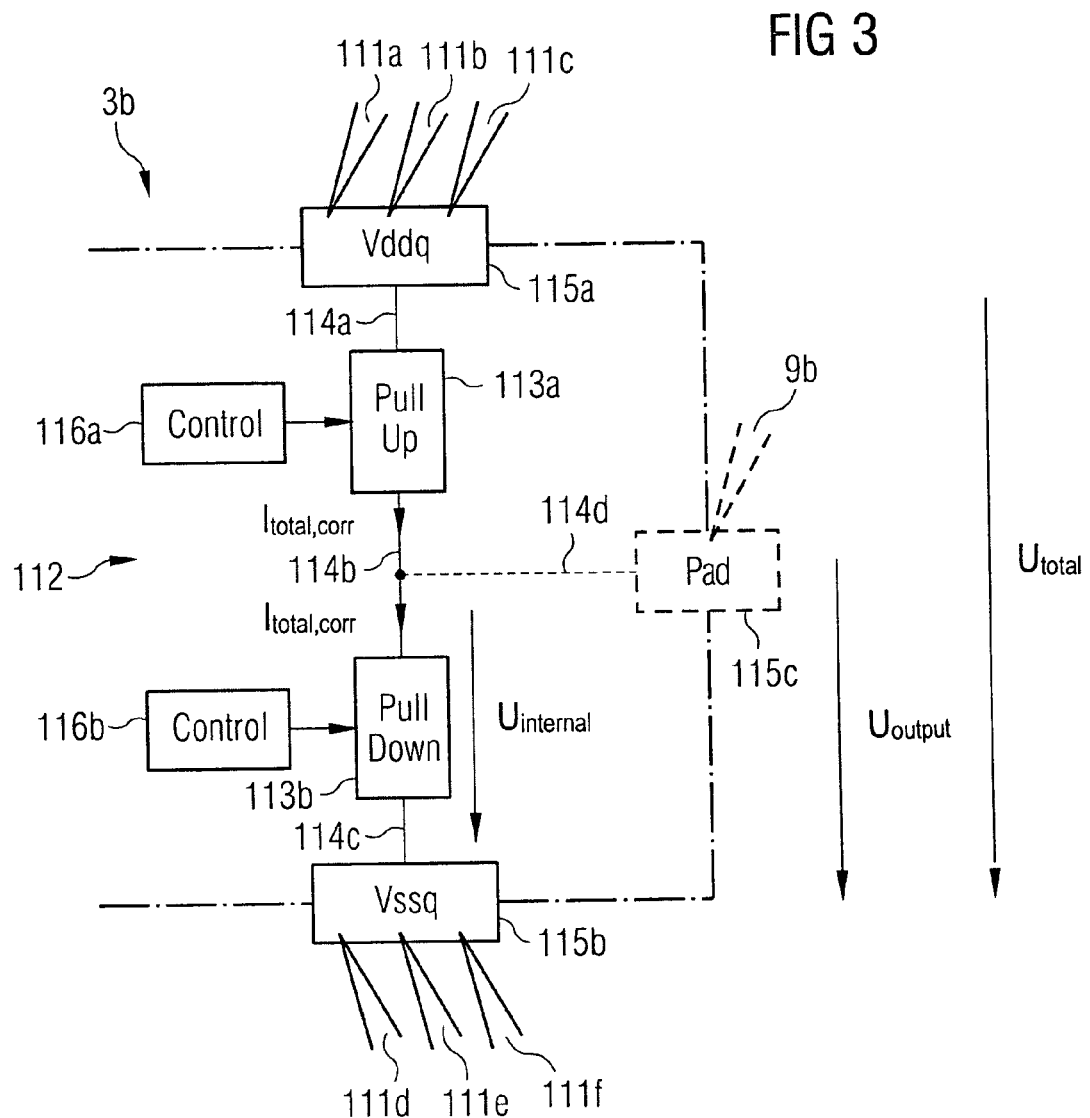
FIG. 3 a schematic detail representation of a portion of a semiconductor device to be tested as illustrated in FIG. 1, as well as of contact needles which are arranged or designed such that a method for measuring and trimming the output impedance of semiconductor device driver apparatuses in accordance with an embodiment of the present invention can be performed.

FIG. 1 shows a schematic representation of the basic structure of a semiconductor device testing system 1 used with the present invention.

This system serves to test semiconductor devices 3a, 3b, 3c, 3d, 3e, 3f positioned on a silicon disc or a wafer 2, respectively, in particular to measure the output impedance of driver devices provided on the respective semiconductor device 3a, 3b, 3c, 3d, 3e, 3f, and to adapt same to the impedance of the signal lines.

The semiconductor devices 3a, 3b, 3c, 3d, 3e, 3f may e.g. be appropriate, integrated (analog or digital) computing circuits, or semiconductor memory devices such as functional memory devices (PLAs, PALs, etc.) or table memory devices (e.g. ROMs or RAMs), in particular SRAMs and DRAMs (here e.g. DRAMs (Dynamic Random Access Memories or dynamic read-write memories, respectively) with double data rate (DDR DRAMs=Double Data Rate DRAMs), preferably high-speed DDR DRAMs).

The voltages or test signals, respectively, necessary for testing the semiconductor devices 3a, 3b, 3c, 3d, 3e, 3f are generated by a testing apparatus 4 and are output at corresponding pads 6 of the testing apparatus 4.

As is further illustrated in FIG. 1, the pads 6 of the testing apparatus 4 may (via corresponding lines, here: a number N of lines 7) be connected to corresponding pads of a semiconductor device probe card 8 which—via corresponding contact needles 9a, 9b being in communication with the probe card pads—may be connected to corresponding (test) pads 10a, 10b provided on the semiconductor devices 3a, 3b, 3c, 3d, 3e, 3f.

The voltages or test signals, respectively, output by the testing apparatus 4 may thus—via the lines 7, the contact needles, 9a, 9b of the semiconductor device probe card 8, and the corresponding semiconductor device pads 10a, 10b—be applied to the respectively desired semiconductor device 3a, 3b, 3c, 3d.

The signals that are output at corresponding semiconductor device pads 10a, 10b in reaction to the test signals input (or the currents resulting from the voltages applied, respectively) are tapped by the corresponding contact needles 9a, 9b of the semiconductor device probe card 8 and are fed to corresponding pads of the testing apparatus 4 via the above-mentioned lines 7, where an evaluation of the corresponding signals or currents, respectively, may take place.

FIG. 2 illustrates a schematic detail representation of a portion of a semiconductor device to be tested as illustrated in FIG. 1 (here: a portion of the semiconductor device 3a), and of contact needles (here: of the contact needle 9a, as well as of further contact needles 11a, 11b, 11c) which are arranged or designed such that a method for measuring and trimming the output impedance of semiconductor device driver devices (in particular for adapting the output impedance to the impedance of the signal lines) can be performed in accordance with prior art.

The semiconductor device 3a comprises a plurality of driver devices 12, each having a pull-up circuit 13a and a pull-down circuit 13b.

As is illustrated in FIG. 2, the pull-up circuit 13a is—e.g. via a line 14a—connected to a supply voltage pad 15a and—e.g. via a line 14b—to the pull-down circuit 13b which—e.g. via a line 14c—is connected to a ground connection 15b.

The line 14b—and thus also the pull-up and the pull-down circuits 13, 13b—are connected to an output pad 15c via a line 14d.

For outputting—later, during the regular operation of the semiconductor device 3a—a "logic One", the pull-up circuit 13a is—controlled by a control device 16a—activated or switched on, respectively, i.e. put in a conductive state. Simultaneously, the pull-down circuit 13b is—controlled by a control device 16b—de-activated or switched off, respectively, i.e. put in a locked state. At the output pad 15c connected between the pull-up and the pull-down circuits 13a, 13b, a "logically high" output signal will then be out-put.

Correspondingly, for outputting a "logic 0", the pull-up circuit 13a is—controlled by the control device 16a—deactivated or switched off, respectively, i.e. put in a locked state, and the pull-down circuit 13b is—controlled by the control device 16b—activated or switched on, respectively, i.e. put in a conductive state. A "logically low" output signal will then be output at the output pad 15c connected between the pull-up and the pull-down circuits 13a, 13b.

The pull-up and the pull-down circuits 13a, 13b each comprise a plurality of transistors connected in parallel (e.g. the pull-up circuit a plurality of p-channel MOSFETs, and the pull-down circuit a plurality of n-channel MOSFETs).

In order to determine how many or which transistors are to be used during the later regular operation of the semiconductor device 3a, and which are not to be used (i.e. for adjusting the driver setting and thus the output impedance), the pull-up circuit 13a is—as is illustrated in FIG. 2 by the continuous lines—switched on, and—as is illustrated in FIG. 2 by the broken lines—the pull-down circuit 13b is switched off.

Furthermore, a supply voltage Vddq is applied to the voltage supply pad 15a by means of the needles 11a, 11b, 11c contacting the supply voltage pad 15a; then, a "logically high" output signal level will be driven by the driver device 12 at the output pad 15c.

Furthermore, a voltage $U_{Pad}$ is applied to the output pad 15c by means of the needle 9a contacting the output pad 15c, the amount of said voltage $U_{Pad}$ corresponding e.g. to half of the voltage level $U_{Pull-up}$ that is—actually—to be driven by the driver device 12 at the output pad 15c.

Subsequently—for all possible driver settings—the current I flowing from the voltage supply pad 15a via the pull-up circuit 13a to the output pad 15c is measured.

From the current I measured (and from the difference between the voltage level $U_{Pull-up}$ and the amount of the voltage $U_{Pad}$ available at the output pad), e.g. in accordance with the formula $$R_{Pull-up} = (U_{Pull-Up} - U_{Pad})/I$$

the respectively applicable output impedance $R_{Pull-up}$ of the pull-up circuit may be determined for the respective driver setting (and thus that driver setting may be selected at which the output impedance $R_{Pull-up}$ of the pull-up circuit—as precisely as possible—corresponds to the desired pull-up circuit output impedance $R_{Pull-Up,desired}$).

Subsequently (correspondingly vice versa to what has been described above), the pull-up circuit 13a may be switched off, and the pull-down circuit 13b may be switched on (so that a "logically low" output signal level is then driven by the driver device 12), and—again for all possible driver settings—the current I' then flowing from the output pad 15c via the pull-down circuit 13b to the ground may be measured (and the respectively applicable output impedance $R_{Pull-Down}$ of the pull-down circuit 13b may be determined for the respective driver setting from the current I' measured (correspondingly similar as described above)).

In this way—corresponding to the pull-up circuit 13a—that driver setting may be determined at which the output impedance $R_{Pull-Down}$ of the pull-down circuit 13b corresponds—as precisely as possible—to the desired pull-down circuit output impedance $R_{Pull-Down,desired}$ (wherein this should be as identical as possible to the above-mentioned (desired) pull-up circuit output impedance $R_{Pull-Up}$ or $R_{Pull-Up,desired}$).

FIG. 3 illustrates a schematic detail representation of a portion of the semiconductor device to be tested as illustrated in FIG. 1 (here: a portion of the semiconductor device 3b), and of contact needles (here: of the contact needle 9b, as well as of further contact needles 111a, 111b, 111c, 111d, 111e, 111f) which are arranged or designed such that a method for measuring and trimming the output impedance of semiconductor device driver devices (in particular for adapting the output impedance to the impedance of the signal lines) can be performed in accordance with an embodiment of the present invention.

The semiconductor device 3b comprises—like the remaining semiconductor elements 3a, 3c, 3d, 3e, 3f on the wafer 2 illustrated in FIG. 1—a plurality of driver devices 112 each having a pull-up circuit 113a and a pull-down circuit 113b.

The pull-up circuit 113a is—e.g. via a line 114a—connected to a supply voltage pad 115a and—e.g. via a line 114b—to the pull-down circuit 113b which—e.g. via a line 114c—is connected to a ground connection 115b.

The line 114b—and thus also the pull-up and the pull-down circuits 113, 113b—are connected to an output pad 115c via a line 114d.

For outputting —later, during the regular operation of the semiconductor device 3b—a "logic One", the pull-up circuit 113a is—controlled by a control device 116a—activated or switched on, respectively, i.e. put in a conductive state. Simultaneously, the pull-down circuit 113b is—controlled by a control device 116b—de-activated or switched off, respectively, i.e. put in a locked state. At the output pad 115c connected between the pull-up and the pull-down circuits 113a, 113b, a "logically high" output signal will then be output (e.g. a voltage level of 1.8 V).

Correspondingly, for outputting a "logic 0", the pull-up circuit 113a is—controlled by the control device 116a—de-activated or switched off, respectively, i.e. put in a locked state, and the pull-down circuit 113b is—controlled by the control device 116b—activated or switched on, respectively, i.e. put in a conductive state. A "logically low" output signal (e.g. a voltage level of 0 V) will then be output at the output pad 115c connected between the pull-up and the pull-down circuits 113a, 113b.

The pull-up and the pull-down circuits 113a, 113b each comprise a plurality of, e.g. 4, transistors connected in parallel (e.g. the pull-up circuit a plurality of, e.g. 4, p-channel MOSFETs, and the pull-down circuit a plurality of, e.g. 4, n-channel MOSFETs).

The sources of the (pull-up) p-channel MOSFETs may be connected with one another via appropriate lines, and via the above-mentioned line 114a to the supply voltage pad 115a. Furthermore—by means of appropriate, further lines—the drains of the (pull-up) p-channel MOSFETs may also be connected with one another, and may be connected to the output pad 115c via the above-mentioned line 114b and the above-mentioned line 114d.

Correspondingly similar, the sources of the (pull-down) n-channel MOSFETs may be connected with one another via appropriate lines, and with the ground connection 115b via the above-mentioned line 114c; and the drains of the (pull-down) n-channel MOSFETs may be connected with one another, and to the above-mentioned line 114b, 114d.

The output impedance of the driver device 112 or of the further driver devices provided in the device 3b, respectively, may, during the test operation of the semiconductor device (i.e. in the scope of the above-mentioned output impedance measuring and trimming method) be adapted to the impedance of the signal lines e.g. by an appropriately selected number of—or appropriately chosen—transistors in the (respective) driver device 112 (in particular an appropriately selected number of—or appropriately chosen—transistors in the pull-up circuit 113*a* and an appropriately selected number of—or appropriately chosen—transistors in the pull-down circuit 113*b*) being, by means of a—per se known—laser fuse method, put to an "enabled" state (i.e. are later on, during the regular operation of the semiconductor device, used for the driving of signals), or being left in a "non-enabled" state (i.e. are later on, during the regular operation of the semiconductor device, not used for the driving of signals).

In order to determine how many or which transistors exactly are to be put in an "enabled" state in the corresponding pull-up or pull-down circuits 113*a*, 113*b* by means of the laser fuse method, and how many or which transistors are to be left in a "non-enabled" state (i.e. for adjusting the driver setting and thus the output impedance), in the present embodiment—other than in the prior art, and as illustrated by the continuous lines in FIG. 3—both the pull-up circuit 113*a* and the pull-down circuit 113*b* are first of all (controlled by the control devices 116*a*, 116*b*) activated or switched on, respectively, i.e. are put to a conductive state. (In the remaining driver devices still contained in the semiconductor device 3*b* all pull-up and pull-down circuits are de-activated or switched off, respectively, i.e. put to a locked state (each controlled by control devices corresponding to the above-mentioned control devices 116*a*, 116*b*)).

As is further illustrated in FIG. 3, in the driver device 112, a plurality of, in particular more than two or three, contact needles (here: the three contact needles 111*a*, 111*b*, 111*c*) contact the above-mentioned supply voltage pad 115*a*, and a plurality of, in particular more than two or three, contact needles (here: the three contact needles 111*d*, 111*e*, 111*f*) contact the above-mentioned ground connection 115*b*.

The contact needles 111*a*, 111*b*, 11*c* are connected to one or several of the above-mentioned testing apparatus pads 6 via one or several of the above-mentioned lines 7 between the semiconductor device probe card 8 and the testing apparatus 4, and the contact needles 111*d*, 111*e*, 111*f* are connected to one or several further testing apparatus pads 6 via one or several further of the above-mentioned lines 7 between the semiconductor device probe card 8 and the testing apparatus 4 (cf. FIG. 1).

The testing apparatus 4 causes—controlled by a test software program stored on a testing apparatus memory device 117—that a supply voltage Vddq is applied to the supply voltage pad 115*a* via the corresponding line(s) 7 and the corresponding contact needles 111*a*, 111*b*, 111*c*.

Furthermore, the testing apparatus 4 causes—also controlled by the test software program stored on the testing apparatus memory device 117—that the ground connection 115*b* is connected to the ground (via the corresponding contact needles 111*d*, 111*e*, 111*f* and the corresponding line(s) 7) (and that the output pad 115*c*—as is illustrated by the broken lines in FIG. 3—is de-activated (is, in particular, neither connected with the ground nor with the supply voltage nor with any other voltage or signal source)).

Subsequently—for all possible driver settings—the current $I_{total}$ flowing from the corresponding testing apparatus pad to the supply voltage pad 115*a* and then (substantially via the pull-up circuit 113*a* and the pull-down circuit 113*b* (cf. the explanations below)) to the ground connection 115*c*, and finally back to the testing apparatus 4 (or to the corresponding testing apparatus pad) is measured (i.e. for all conceivable combinations of transistors respectively "enabled", i.e. used for the driving of signals, and "non-enabled", i.e. not used for the driving of signals, in the pull-up and in the pull-down circuits 113*a*, 113*b* (i.e. with e.g. 16 possible settings for the pull-up transistors and 16 possible settings for the pull-down transistors, for a total of 16×16=256 different driver settings)).

Before (or, alternatively: after) the "total current" $I_{total}$ is measured repeatedly, e.g. 256 times, in the above-described manner—for different driver settings, respectively—the "standby current" $I_{standby}$ is measured, as will be explained more exactly in the following (cf. explanations below).

To this end—with all driver devices 112 contained in the semiconductor device 3*b*—all pull-up and pull-down circuits 113*a*, 113*b* are—each controlled by appropriate control devices 116*a*, 116*b*—de-activated or switched off, respectively, i.e. put in a locked state (and thus the semiconductor device 3*b* is put to an idle-/clock stop state); subsequently, the current (standby current $I_{standby}$) flowing from the corresponding testing apparatus pad to the supply voltage pad 115*a*, and then from the ground connection 115*c* back to the testing apparatus 4 (or to the corresponding testing apparatus pad, respectively) is again measured.

This measurement is necessary when—as in the present embodiment—not only the above-mentioned driver devices 112 or output pads 115*c*, respectively, are—as illustrated in FIG. 3—connected between the supply voltage pad 115*a* and the ground connection 115*b*, but additionally further devices provided on the semiconductor device 3*b* (not illustrated in FIG. 3) are connected therebetween (the supply voltage Vddq thus does not only serve to supply the driver devices 112 or the output pads 115*c*, respectively, i.e. serves as "pad supply", but, in addition, serves to supply the above-mentioned further devices provided on the semiconductor device, i.e. serves as "chip power supply").

If this is the case, a (low, though,) standby current $I_{standby}$ flows also in the above-mentioned idle-/clock stop state from the supply voltage pad 115*a* through the above-mentioned further semiconductor device elements through to the ground connection 115*b*.

For the—exact—determination of the current actually flowing through the pull-up and the pull-down circuits 113*a*, 113*b* (and not through the above-mentioned further semiconductor device elements) during the above-mentioned simultaneous activating or switching on, respectively, of both the pull-up and the pull-down circuits 113*a*, 113*b*, this standby current $I_{standby}$ has to be deducted from the total current $I_{total}$ determined in the above-explained way.

The (actual (corrected)) total current $I_{total,corr}$ flowing—with the above-mentioned different driver settings—through the pull-up and the pull down circuits 113*a*, 113*b* thus results as follows:

$$I_{total,corr} = I_{total} - I_{standby} \qquad \text{(formula (1))}$$

From the (corrected) values for the total current $I_{total,corr}$ flowing through the pull-up and the pull-down circuits 113*a*, 113*b*—which values are different for the respectively different driver settings—, and from the amount of the voltage $U_{total}$ (here: Vddq) altogether available at the pull-up and the pull-down circuits 113*a*, 113*b*, the total output impedance $R_{total}$ of the pull-up and the pull-down circuits 113*a*, 113*b* (or of the driver device 112, respectively) can be determined for the respective driver setting, e.g. in accordance with the formula $$R_{total} = U_{total}/I_{total,corr} \qquad \text{(formula (2)) or}$$

$$R_{total} = Vddq/I_{total,corr} \qquad \text{(formula (2'))}$$

From the above-mentioned (e.g. 256 different) driver settings, now those are selected at which the total output impedance $R_{total}$ determined corresponds to a desired value of the total output impedance $R_{total,desired}$ (or, more exactly, e.g. those driver settings at which the total output impedance $R_{total}$ determined deviates at most by a predetermined, low percentage or absolute amount from the desired total output impedance $R_{total,desired}$, or a predetermined number of driver settings at which the total output impedance $R_{total}$ determined is closest to the desired total output impedance $R_{total,desired}$).

The desired total output impedance $R_{total,desired}$ may be determined from the respective values for the (desired) pull-up circuit output impedance $R_{Pull-Up,desired}$ and the (desired) pull-down circuit output impedance $R_{Pull-Down,desired}$, and corresponds in particular to the sum of these two output impedance desired values (i.e. $R_{total,desired} = R_{Pull-Up,desired} + R_{Pull-Down,desired}$).

The pull-down circuit output impedance $R_{Pull-Down,desired}$ (that is desired or is to be set) should have the same value as the pull-up circuit output impedance $R_{Pull-Up,desired}$ (that is desired or is to be set), so that the following applies: $R_{total,desired} = 2 \times R_{Pull-Up,desired}$ or $R_{total,desired} = 2 \times R_{Pull-Down,desired}$.

The desired value for $R_{Pull-Up,desired}$ and $R_{Pull-Down,desired}$ may, for instance—correspondingly identical to the impedance of the respective signal line—be 45 OHM, and, accordingly, the desired value for $R_{total,desired}$ may e.g. be 90 OHM.

In a next step—for the above-mentioned, selected driver settings, in particular for those driver settings at which the total output impedance $R_{total}$ determined corresponds to the desired value for the total output impedance $R_{total,desired}$—the voltage $U_{Output}$ available at the output pad 115c is measured—with simultaneously activated or switched-on, respectively, pull-up and pull-down circuits 113a, 113b, as described above—(namely in that the voltage available between the contact needle 9b—that contacts the output pad 115c—and the contact needles 111d, 111e, 111f—that contact the ground connection 115b (or, alternatively, the contact needles 111a, 111b, 111c that contact the supply voltage pad 115b)—is measured by the testing apparatus 4, i.e. directly the voltage $U_{Output}$ (or, alternatively, the voltage Vddq−$U_{Output}$)).

Subsequently—for the above-mentioned, selected driver settings, in particular for those driver settings at which the total output impedance $R_{total}$ determined corresponds to the desired value of the total output impedance $R_{total,desired}$—that driver setting is selected at which the voltage $U_{Output}$ at the output pad 115c measured in the above-mentioned way is as close as possible to a respectively desired output voltage desired value $U_{desired}$.

This output voltage desired value $U_{desired}$ should lie as exactly as possible between the desired voltage level of a "logically high" output signal—output later on during regular operation—(here: a level of e.g. 1.8 V), and the desired output level of a "logically low" output signal—output later on during regular operation—(here: a level of 0 V) (e.g. 0.9 V).

This ensures that $R_{Pull-Up}$ is as great as $R_{Pull-Down}$ (and thus $R_{Pull-Up}$ is as great as $R_{Pull-Up,desired}$, and $R_{Pull-Down}$ is as great as $R_{Pull-Down,desired}$).

It is not absolutely necessary to measure the current for all the 256 different settings, as described above. Conceivable alternatives are e.g.:

The measurements (current and subsequently voltage) are first of all only performed for "typical" settings (e.g. the pull-up settings 7 to 10 and the pull-down settings 9 to 13). Only if the target values are not found here, other settings will also be used;

First of all, the "symmetrical" settings are determined, i.e. those settings at which pull-up and pull-down are equally strong. Example: The pull-down setting 1 is activated, and then (via a voltage measurement at the pad) the pertinent pull-up setting is determined. Subsequently, the pull-down setting 2 is activated, and (via a voltage measurement at the pad) the pertinent pull-up setting is searched, etc. Subsequently, that setting is selected among those 16 settings at which the total current over pull-up and pull-down exactly corresponds to the desired (double) output impedance.

The above-described driver setting selection methods may—in a corresponding way—be performed e.g. for all driver devices provided with the semiconductor device 3b (i.e. each individual driver device of the semiconductor device 3b may be calibrated individually).

Alternatively, the driver setting determined in the above-mentioned way for a particular driver device 112 may (without further, separate measurements being performed) be taken over for several, in particular for all, further driver devices provided on the semiconductor device 3b.

In a further alternative, no driver device 112 actually used for the driving of signals (later on, during regular operation of the semiconductor device 3b) is used for adjusting the driver settings, but a test driver device—merely used for selecting the driver setting in accordance with the above-explained method—is used, the structure of which is identical to that illustrated in FIG. 3 (the driver setting determined by means of this test driver device may then be used correspondingly for all driver devices provided on the semiconductor device 3b and actually used during regular operation).

A test driver device of this kind need not necessarily comprise an output pad corresponding to the output pad 115c as provided with the driver device 112 illustrated in FIG. 3, but may also be designed without such an output pad (or not be connected with such a pad, respectively).

Instead of measuring—as described above—the voltage $U_{Output}$ at a corresponding output pad 115c, the voltage $U_{internal}$—corresponding to this voltage—may then be measured over the pull-up or pull-down circuit, respectively, e.g. by a device provided on the semiconductor device itself (e.g. an appropriate on-chip voltage comparator).

Since, in all of the above-mentioned methods, the corresponding voltage ($U_{Output}$ or $U_{internal}$, respectively) is measured current-free (or almost current-free), the measuring result is not (or only slightly) influenced by a—possibly uncontrollably high—dirtying e.g. of the contact needle 9b. Therefore, by means of the above-described methods, it is possible to set the output impedance of the respective driver devices 112 with higher accuracy than is the case in prior art.

The invention claimed is:

1. A method for measuring and trimming the impedance of a driver device in a semiconductor device during a test being carried out before the regular operation of the semiconductor device, the driver device of the semiconductor device including each a pull-up circuit and a pull-down circuit, the method comprising:
substantially simultaneously activating both the pull-up circuit and the pull-down circuit; and
determining a first current flowing through the pull-up circuit or the pull-down circuit, respectively, with substantially simultaneously activated pull-up and pull down circuits during the test carried out before the regular operation of the semiconductor device.

2. The method according to claim 1, further comprising: determining a voltage dropping over the pull-up and/or pull-down circuit, in particular with substantially simultaneously activated pull-up and pull-down circuits.

3. The method according to claim 1, further comprising: determining a voltage dropping over the substantially simultaneously activated pull-up and pull-down circuits.

4. The method according to claim 1, wherein one or several of the method steps are performed several times in sequence, each with different settings of transistors contained in the pull-up or pull-down circuits, respectively.

5. The method according to claim 1, the method comprising: determining a total impedance of the pull-up and pull-down circuits.

6. The method according to claim 4, wherein, on the basis of a total impedance determined or the first current determined, respectively, and a voltage dropping over the pull-up and/or pull-down circuit as determined, one of said settings is selected that is to be used during regular operation of the device.

7. The method according to claim 1, wherein the device is a driver device used for the driving of output signals during the regular operation of the semiconductor device during the test carried out before the regular operation of the semiconductor device.

8. The method according to claim 1, wherein the device is a test device not used for the driving of output signals during the regular operation of the semiconductor device, the test device for selecting the driver setting for at least one other semiconductor device during the test carried out before the regular operation of the at least one other semiconductor device.

9. The method according to claim 8, wherein the test device is connected with a device provided on the semiconductor device itself, by means of which a voltage dropping over the pull-up and/or pull-down circuit is determined.

10. A method for measuring and trimming the impedance of a driver device in a semiconductor device during a test being carried out before the regular operation of the semiconductor device, the driver device of the semiconductor device including each a pull-up circuit and a pull-down circuit, the method comprising:
   joint activating both the pull-up circuit and the pull-down circuit; and
   determining a first current flowing through the pull-up circuit or the pull-down circuit, respectively, with jointly activated pull-up and pull down circuits during the test carried out before the regular operation of the semiconductor device; wherein the pull-up or pull-down circuits, respectively, are connected to a supply voltage pad or a ground connection, respectively, of the semiconductor device, and the method further comprising:
   joint de-activating both the pull-up circuit and the pull-down circuit; and
   determining a standby current flowing between the supply voltage pad and the ground connection with jointly de-activated pull-up and pull down circuits.

11. The method according to claim 10, wherein the pull-up or pull-down circuits, respectively, are connected to a voltage supply pad or a ground connection, respectively, of the semiconductor device, and the method further comprising:
   joint activating both the pull-up circuit and the pull-down circuit; and
   determining a total current flowing between the supply voltage pad and the ground connection with jointly activated pull-up and pull-down circuits.

12. The method according to claim 11, further comprising determining the first current by deducting the standby current from the total current.

* * * * *

UNITED STATES PATENT AND TRADEMARK OFFICE
CERTIFICATE OF CORRECTION

PATENT NO. : 7,126,326 B2
APPLICATION NO. : 10/663448
DATED : October 24, 2006
INVENTOR(S) : Muller et al.

It is certified that error appears in the above-identified patent and that said Letters Patent is hereby corrected as shown below:

Please Delete *Columns 1 Line 1* through *Columns 12 Line 36* and Insert *Columns 1 Line 1* through *Columns 12 Line 26* as attached.

Signed and Sealed this

Seventeenth Day of February, 2009

JOHN DOLL
*Acting Director of the United States Patent and Trademark Office*

SEMICONDUCTOR DEVICE TESTING APPARATUS, SEMICONDUCTOR DEVICE TESTING SYSTEM, AND SEMICONDUCTOR DEVICE TESTING METHOD FOR MEASURING AND TRIMMING THE OUTPUT IMPEDANCE OF DRIVER DEVICES

FIELD OF THE INVENTION

The disclosure relates to a semiconductor device testing apparatus, a semiconductor device testing system, and a semiconductor device testing method, in particular a method for measuring or trimming, respectively, the impedance of driver devices provided in a semiconductor device.

BACKGROUND SECTION

Semiconductor devices, e.g. appropriate, integrated (analog or digital) computing circuits, semiconductor memory devices such as functional memory devices (PLAs, PALs, etc.) and table memory devices (e.g. ROMs or RAMs, in particular SRAMs and DRAMs), etc. are subject to comprehensive tests e.g. in the finished and/or semifinished state.

In the scope of such kind of test, for instance with particular DRAMs (Dynamic Random Access Memories or dynamic read-write memories, respectively), in particular with DDR DRAMs (Double Data Rate DRAMs), the output impedance of the driver devices provided in the chip or semiconductor device, respectively, may be adapted to the impedance of the signal lines.

Every driver device may e.g. comprise a pull-up and a pull-down circuit being connected in series.

The pull-up circuit is e.g. connected to the supply voltage, and the pull-down circuit is connected to the ground.

For outputting a "logic One" (during the regular operation of the semiconductor device), the pull-up circuit may be switched on, i.e. be put in a conductive state, and the pull-down circuit may be switched off, i.e. be put in a locked state—then, a "logically high" output signal will be output at an output pad connected between the pull-up and the pull-down circuits.

Correspondingly, for outputting a "logic 0"—during the regular operation of the semiconductor device—, the pull-up circuit is switched off, i.e. put in a locked state, and the pull-down circuit is switched on, i.e. put in a conductive state, so that, correspondingly, a "logically low" output signal is output at the output pad.

The pull-up and the pull-down circuits may e.g. each comprise a plurality of transistors connected in parallel (e.g. the pull-up circuit a plurality of p-channel MOSFETs and the pull-down circuit a plurality of n-channel MOSFETs).

The output impedance of the driver devices provided in the chip or in the semiconductor device, respectively, may be adapted during the testing operation of the semiconductor device (i.e. in the scope of an appropriate testing method) to the impedance of the signal lines for instance by the fact that, by means of a so-called laser fuse method from chip to chip (e.g. from driver device to driver device), a different number of transistors in the respective driver devices is put to the "enabled" state (i.e. is later on, during the regular operation of the semiconductor device, used for driving signals), or is left in a "non-enabled" state (i.e. is later on, during the regular operation of the semiconductor device, not used for driving signals).

In order to determine how many (or which) transistors are to be put in an "enabled" state by means of the laser fuse method, and how many (or which) transistors are to be left in a "non-enabled" state (so-called "driver setting"), the pull-up circuit may first of all be switched on and the pull-down circuit may be switched off (then, a "logically high" output signal level is driven by the driver device).

Subsequently, a reference voltage is applied to the above-mentioned output pad—e.g. by means of a corresponding signal needle—, and the current flowing from the supply voltage via the pull-up circuit to the output pad is then measured for all possible driver settings.

From the current measured, the respectively applicable output impedance of the pull-up circuit may be determined for the respective driver setting in a manner known per se (and thus that driver setting may be selected at which the output impedance of the pull-up circuit corresponds—as precisely as possible—to the desired pull-up circuit output impedance).

Subsequently (correspondingly vice versa), the pull-up circuit may be switched off and the pull-down circuit may be switched on (so that a "logically low" output signal level is then driven by the driver device), and—again for all possible driver settings—the current then flowing from the output pad via the pull-down circuit to the ground may be measured.

From the current measured, the respectively applicable output impedance of the pull-down circuit may then be determined for the respective driver setting in a manner known per se (and thus that driver setting may be selected at which the output impedance of the pull-down circuit corresponds—as precisely as possible—to the desired pull-down circuit output impedance (wherein this should be as identical as possible to the above-mentioned pull-up circuit impedance)).

In the case of this trimming method, however, the problem arises that—depending on the degree of dirtying of the signal needle used for measurement, via which, as explained above, a (reference) voltage is applied to the output pad—the signal needle contact resistance may vary strongly.

The respective signal needle contact resistance influences—in a way difficult to predict—the current flowing through the output pad (and thus—in a way difficult to predict—the respective value determined for the output impedance).

Therefore, with the above-described method, the output impedance can be set with relatively small accuracy only.

SUMMARY OF THE INVENTION

A semiconductor device testing apparatus, a novel semiconductor device testing system, a novel semiconductor device, and a novel semiconductor device testing method, in particular a novel method for measuring or trimming, respectively, the impedance of driver devices provided in a semiconductor device.

In accordance with a basic idea of the invention, a method for measuring or trimming, respectively, the impedance of driver devices provided in a semiconductor device is provided, wherein a device comprising a pull-up circuit and a pull-down circuit, in particular a driver device, is used, and wherein the method comprises the following steps:

- joint activating of both the pull-up circuit and the pull-down circuit; and
- determining of the current ($I_{total,corr}$) flowing through the pull-up circuit or the pull-down circuit, respectively, with—jointly—activated pull-up and pull-down circuits.

Advantageously, the method additionally comprises the following step:

determining of the voltage ($U_{output}$) available at the pull-up circuit or the pull-down circuit, respectively (or an output pad, respectively) with—jointly—activated pull-up and pull-down circuits.

It is of particular advantage when the above-mentioned method steps are performed several times in sequence—always with different settings of transistors comprised in the pull-up or pull-down circuit, respectively.

From the respective voltage ($U_{output}$) determined for the corresponding settings, and from the respective current ($I_{total, corr}$) determined for the corresponding settings, that driver setting may be determined at which the output impedance of the pull-up and pull-down circuits corresponds—as precisely as possible—to the desired pull-up and pull-down circuit output impedance, as will be explained in detail further below.

Since the above-mentioned voltage ($U_{output}$) can be measured current-free (or almost current-free), the measuring result is not (or only slightly) influenced by an—uncontrollably strong—dirtying of a signal needle used for measuring the above-mentioned voltage ($U_{output}$) and contacting the output pad.

Therefore, by means of the method according to the invention, the output impedance of the respective driver devices may be set with higher accuracy than is the case in prior art.

BRIEF DESCRIPTION OF THE DRAWINGS

In the following, the invention will be explained in detail by means of embodiments and the enclosed drawing. The drawing shows:

FIG. 1 a schematic representation of the basic structure of a semiconductor testing system used with the present invention;

FIG. 2 a schematic detail representation of a portion of a semiconductor device to be tested as illustrated in FIG. 1, as well as of contact needles which are arranged or designed such that a method for measuring and trimming the output impedance of semiconductor device driver apparatuses in accordance with prior art can be performed; and FIG. 3 a schematic detail representation of a portion of a semiconductor device to be tested as illustrated in FIG. 1, as well as of contact needles which are arranged or designed such that a method for measuring and trimming the output impedance of semiconductor device driver apparatuses in accordance with an embodiment of the present invention can be performed.

DETAILED DESCRIPTION

FIG. 1 shows a schematic representation of the basic structure of a semiconductor device testing system 1 used with the present invention.

This system serves to test semiconductor devices $3a$, $3b$, $3c$, $3d$, $3e$, $3f$ positioned on a silicon disc or a wafer 2, respectively, in particular to measure the output impedance of driver devices provided on the respective semiconductor device $3a$, $3b$, $3c$, $3d$, $3e$, $3f$, and to adapt same to the impedance of the signal lines.

The semiconductor devices $3a$, $3b$, $3c$, $3d$, $3e$, $3f$ may e.g. be appropriate, integrated (analog or digital) computing circuits, or semiconductor memory devices such as functional memory devices (PLAs, PALs, etc.) or table memory devices (e.g. ROMs or RAMs), in particular SRAMs and DRAMs (here e.g. DRAMs (Dynamic Random Access Memories or dynamic read-write memories, respectively) with double data rate (DDR DRAMs=Double Data Rate DRAMs), preferably high-speed DDR DRAMs).

The voltages or test signals, respectively, necessary for testing the semiconductor devices $3a$, $3b$, $3c$, $3d$, $3e$, $3f$ are generated by a testing apparatus 4 and are output at corresponding pads 6 of the testing apparatus 4.

As is further illustrated in FIG. 1, the pads 6 of the testing apparatus 4 may (via corresponding lines, here: a number N of lines 7) be connected to corresponding pads of a semiconductor device probe card 8 which—via corresponding contact needles $9a$, $9b$ being in communication with the probe card pads—may be connected to corresponding (test) pads $10a$, $10b$ provided on the semiconductor devices $3a$, $3b$, $3c$, $3d$, $3e$, $3f$.

The voltages or test signals, respectively, output by the testing apparatus 4 may thus—via the lines 7, the contact needles $9a$, $9b$ of the semiconductor device probe card 8, and the corresponding semiconductor device pads $10a$, $10b$—be applied to the respectively desired semiconductor device $3a$, $3b$, $3c$, $3d$.

The signals that are output at corresponding semiconductor device pads $10a$, $10b$ in reaction to the test signals input (or the currents resulting from the voltages applied, respectively) are tapped by the corresponding contact needles $9a$, $9b$ of the semiconductor device probe card 8 and are fed to corresponding pads of the testing apparatus 4 via the above-mentioned lines 7, where an evaluation of the corresponding signals or currents, respectively, may take place.

FIG. 2 illustrates a schematic detail representation of a portion of a semiconductor device to be tested as illustrated in FIG. 1 (here: a portion of the semiconductor device $3a$), and of contact needles (here: of the contact needle $9a$, as well as of further contact needles $11a$, $11b$, $11c$) which are arranged or designed such that a method for measuring and trimming the output impedance of semiconductor device driver devices (in particular for adapting the output impedance to the impedance of the signal lines) can be performed in accordance with prior art.

The semiconductor device $3a$ comprises a plurality of driver devices 12, each having a pull-up circuit $13a$ and a pull-down circuit $13b$.

As is illustrated in FIG. 2, the pull-up circuit $13a$ is—e.g. via a line $14a$—connected to a supply voltage pad $15a$ and—e.g. via a line $14b$—to the pull-down circuit $13b$ which—e.g. via a line $14c$—is connected to a ground connection $15b$.

The line $14b$—and thus also the pull-up and the pull-down circuits 13, $13b$—are connected to an output pad $15c$ via a line $14d$.

For outputting—later, during the regular operation of the semiconductor device $3a$—a "logic One", the pull-up circuit $13a$ is—controlled by a control device $16a$—activated or switched on, respectively, i.e. put in a conductive state. Simultaneously, the pull-down circuit $13b$ is—controlled by a control device $16b$—de-activated or switched off, respectively, i.e. put in a locked state. At the output pad $15c$ connected between the pull-up and the pull-down circuits $13a$, $13b$, a "logically high" output signal will then be out-put.

Correspondingly, for outputting a "logic 0", the pull-up circuit $13a$ is—controlled by the control device $16a$—de-activated or switched off, respectively, i.e. put in a locked state, and the pull-down circuit $13b$ is—controlled by the control device $16b$—activated or switched on, respectively, i.e. put in a conductive state. A "logically low" output signal will then be output at the output pad $15c$ connected between the pull-up and the pull-down circuits $13a$, $13b$.

The pull-up and the pull-down circuits 13a, 13b each comprise a plurality of transistors connected in parallel (e.g. the pull-up circuit a plurality of p-channel MOSFETs, and the pull-down circuit a plurality of n-channel MOSFETs).

In order to determine how many or which transistors are to be used during the later regular operation of the semiconductor device 3a, and which are not to be used (i.e. for adjusting the driver setting and thus the output impedance), the pull-up circuit 13a is—as is illustrated in FIG. 2 by the continuous lines—switched on, and—as is illustrated in FIG. 2 by the broken lines—the pull-down circuit 13b is switched off.

Furthermore, a supply voltage Vddq is applied to the voltage supply pad 15a by means of the needles 11a, 11b, 11c contacting the supply voltage pad 15a; then, a "logically high" output signal level will be driven by the driver device 12 at the output pad 15c.

Furthermore, a voltage $U_{Pad}$ is applied to the output pad 15c by means of the needle 9a contacting the output pad 15c, the amount of said voltage $U_{Pad}$ corresponding e.g. to half of the voltage level $U_{Pull-up}$ that is—actually—to be driven by the driver device 12 at the output pad 15c.

Subsequently—for all possible driver settings—the current I flowing from the voltage supply pad 15a via the pull-up circuit 13a to the output pad 15c is measured.

From the current I measured (and from the difference between the voltage level $U_{Pull-up}$ and the amount of the voltage $U_{Pad}$ available at the output pad), e.g. in accordance with the formula $$R_{Pull-up} = (U_{Pull-up} - U_{Pad})/I$$

the respectively applicable output impedance $R_{Pull-up}$ of the pull-up circuit may be determined for the respective driver setting (and thus that driver setting may be selected at which the output impedance $R_{Pull-up}$ of the pull-up circuit—as precisely as possible—corresponds to the desired pull-up circuit output impedance $R_{Pull-Up,desired}$).

Subsequently (correspondingly vice versa to what has been described above), the pull-up circuit 13a may be switched off, and the pull-down circuit 13b may be switched on (so that a "logically low" output signal level is then driven by the driver device 12), and—again for all possible driver settings—the current I' then flowing from the output pad 15c via the pull-down circuit 13b to the ground may be measured (and the respectively applicable output impedance $R_{Pull-Down}$ of the pull-down circuit 13b may be determined for the respective driver setting from the current I' measured (correspondingly similar as described above)).

In this way—corresponding to the pull-up circuit 13a—that driver setting may be determined at which the output impedance $R_{Pull-Down}$ of the pull-down circuit 13b corresponds—as precisely as possible—to the desired pull-down circuit output impedance $R_{Pull-Down,desired}$ (wherein this should be as identical as possible to the above-mentioned (desired) pull-up circuit output impedance $R_{Pull-Up}$ or $R_{Pull-Up,desired}$).

FIG. 3 illustrates a schematic detail representation of a portion of the semiconductor device to be tested as illustrated in FIG. 1 (here: a portion of the semiconductor device 3b), and of contact needles (here: of the contact needle 9b, as well as of further contact needles 111a, 111b, 111c, 111d, 111e, 111f) which are arranged or designed such that a method for measuring and trimming the output impedance of semiconductor device driver devices (in particular for adapting the output impedance to the impedance of the signal lines) can be performed in accordance with an embodiment of the present invention.

The semiconductor device 3b comprises—like the remaining semiconductor elements 3a, 3c, 3d, 3e, 3f on the wafer 2 illustrated in FIG. 1—a plurality of driver devices 112 each having a pull-up circuit 113a and a pull-down circuit 113b.

The pull-up circuit 113a is—e.g. via a line 114a—connected to a supply voltage pad 115a and—e.g. via a line 114b—to the pull-down circuit 113b which—e.g. via a line 114c—is connected to a ground connection 115b.

The line 114b—and thus also the pull-up and the pull-down circuits 113, 113b—are connected to an output pad 115c via a line 114d.

For outputting—later, during the regular operation of the semiconductor device 3b—a "logic One", the pull-up circuit 113a is—controlled by a control device 116a—activated or switched on, respectively, i.e. put in a conductive state. Simultaneously, the pull-down circuit 113b is—controlled by a control device 116b—de-activated or switched off, respectively, i.e. put in a locked state. At the output pad 115c connected between the pull-up and the pull-down circuits 113a, 113b, a "logically high" output signal will then be output (e.g. a voltage level of 1.8 V).

Correspondingly, for outputting a "logic 0", the pull-up circuit 113a is—controlled by the control device 116a—de-activated or switched off, respectively, i.e. put in a locked state, and the pull-down circuit 113b is—controlled by the control device 116b—activated or switched on, respectively, i.e. put in a conductive state. A "logically low" output signal (e.g. a voltage level of 0 V) will then be output at the output pad 115c connected between the pull-up and the pull-down circuits 113a, 113b.

The pull-up and the pull-down circuits 113a, 113b each comprise a plurality of, e.g. 4, transistors connected in parallel (e.g. the pull-up circuit a plurality of, e.g. 4, p-channel MOSFETs, and the pull-down circuit a plurality of, e.g. 4, n-channel MOSFETs).

The sources of the (pull-up) p-channel MOSFETs may be connected with one another via appropriate lines, and via the above-mentioned line 114a to the supply voltage pad 115a. Furthermore—by means of appropriate, further lines—the drains of the (pull-up) p-channel MOSFETs may also be connected with one another, and may be connected to the output pad 115c via the above-mentioned line 114b and the above-mentioned line 114d.

Correspondingly similar, the sources of the (pull-down) n-channel MOSFETs may be connected with one another via appropriate lines, and with the ground connection 115b via the above-mentioned line 114c; and the drains of the (pull-down) n-channel MOSFETs may be connected with one another, and to the above-mentioned line 114b, 114d.

The output impedance of the driver device 112 or of the further driver devices provided in the device 3b, respectively, may, during the test operation of the semiconductor device (i.e. in the scope of the above-mentioned output impedance measuring and trimming method) be adapted to the impedance of the signal lines e.g. by an appropriately selected number of—or appropriately chosen—transistors in the (respective) driver device 112 (in particular an appropriately selected number of—or appropriately chosen—transistors in the pull-up circuit 113a and an appropriately selected number of—or appropriately chosen—transistors in the pull-down circuit 113b) being, by means of a—per se known—laser fuse method, put to an "enabled" state (i.e. are later on, during the regular operation of the semiconductor device, used for the driving of signals), or being left in a "non-enabled" state (i.e. are later on, during the regular operation of the semiconductor device, not used for the driving of signals).

In order to determine how many or which transistors exactly are to be put in an "enabled" state in the corresponding pull-up or pull-down circuits 113a, 113b by means of the laser fuse method, and how many or which transistors are to be left in a "non-enabled" state (i.e. for adjusting the driver setting and thus the output impedance), in the present embodiment—other than in the prior art, and as illustrated by the continuous lines in FIG. 3—both the pull-up circuit 113a and the pull-down circuit 113b are first of all (controlled by the control devices 116a, 116b) activated or switched on, respectively, i.e. are put to a conductive state. (In the remaining driver devices still contained in the semiconductor device 3b all pull-up and pull-down circuits are de-activated or switched off, respectively, i.e. put to a locked state (each controlled by control devices corresponding to the above-mentioned control devices 116a, 116b)).

As is further illustrated in FIG. 3, in the driver device 112, a plurality of, in particular more than two or three, contact needles (here: the three contact needles 111a, 111b, 111c) contact the above-mentioned supply voltage pad 115a, and a plurality of, in particular more than two or three, contact needles (here: the three contact needles 111d, 111e, 111f) contact the above-mentioned ground connection 115b.

The contact needles 111a, 111b, 111c are connected to one or several of the above-mentioned testing apparatus pads 6 via one or several of the above-mentioned lines 7 between the semiconductor device probe card 8 and the testing apparatus 4, and the contact needles 111d, 111e, 111f are connected to one or several further testing apparatus pads 6 via one or several further of the above-mentioned lines 7 between the semiconductor device probe card 8 and the testing apparatus 4 (cf. FIG. 1).

The testing apparatus 4 causes—controlled by a test software program stored on a testing apparatus memory device 117—that a supply voltage Vddq is applied to the supply voltage pad 115a via the corresponding line(s) 7 and the corresponding contact needles 111a, 111b, 111c.

Furthermore, the testing apparatus 4 causes—also controlled by the test software program stored on the testing apparatus memory device 117—that the ground connection 115b is connected to the ground (via the corresponding contact needles 111d, 111e, 111f and the corresponding line(s) 7) (and that the output pad 115c—as is illustrated by the broken lines in FIG. 3—is de-activated (is, in particular, neither connected with the ground nor with the supply voltage nor with any other voltage or signal source)).

Subsequently—for all possible driver settings—the current $I_{total}$ flowing from the corresponding testing apparatus pad to the supply voltage pad 115a and then (substantially via the pull-up circuit 113a and the pull-down circuit 113b (cf. the explanations below)) to the ground connection 115c, and finally back to the testing apparatus 4 (or to the corresponding testing apparatus pad) is measured (i.e. for all conceivable combinations of transistors respectively "enabled", i.e. used for the driving of signals, and "non-enabled", i.e. not used for the driving of signals, in the pull-up and in the pull-down circuits 113a, 113b (i.e. with e.g. 16 possible settings for the pull-up transistors and 16 possible settings for the pull-down transistors, for a total of 16×16=256 different driver settings)).

Before (or, alternatively: after) the "total current" $I_{total}$ is measured repeatedly, e.g. 256 times, in the above-described manner—for different driver settings, respectively—the "standby current" $I_{standby}$ is measured, as will be explained more exactly in the following (cf. explanations below).

To this end—with all driver devices 112 contained in the semiconductor device 3b—all pull-up and pull-down circuits 113a, 113b are—each controlled by appropriate control devices 116a, 116b—de-activated or switched off, respectively, i.e. put in a locked state (and thus the semiconductor device 3b is put to an idle-/clock stop state); subsequently, the current (standby current $I_{standby}$) flowing from the corresponding testing apparatus pad to the supply voltage pad 115a, and then from the ground connection 115c back to the testing apparatus 4 (or to the corresponding testing apparatus pad, respectively) is again measured.

This measurement is necessary when—as in the present embodiment—not only the above-mentioned driver devices 112 or output pads 115c, respectively, are—as illustrated in FIG. 3—connected between the supply voltage pad 115a and the ground connection 115b, but additionally further devices provided on the semiconductor device 3b (not illustrated in FIG. 3) are connected therebetween (the supply voltage Vddq thus does not only serve to supply the driver devices 112 or the output pads 115c, respectively, i.e. serves as "pad supply", but, in addition, serves to supply the above-mentioned further devices provided on the semiconductor device, i.e. serves as "chip power supply").

If this is the case, a (low, though,) standby current $I_{standby}$ flows also in the above-mentioned idle-/clock stop state from the supply voltage pad 115a through the above-mentioned further semiconductor device elements through to the ground connection 115b.

For the—exact—determination of the current actually flowing through the pull-up and the pull-down circuits 113a, 113b (and not through the above-mentioned further semiconductor device elements) during the above-mentioned simultaneous activating or switching on, respectively, of both the pull-up and the pull-down circuits 113a, 113b, this standby current $I_{standby}$ has to be deducted from the total current $I_{total}$ determined in the above-explained way.

The (actual (corrected)) total current $I_{total,corr}$ flowing—with the above-mentioned different driver settings—through the pull-up and the pull down circuits 113a, 113b thus results as follows:

$$I_{total,corr} = I_{total} - I_{standby} \quad \text{(formula (1))}$$

From the (corrected) values for the total current $I_{total,corr}$ flowing through the pull-up and the pull-down circuits 113a, 113b—which values are different for the respectively different driver settings—, and from the amount of the voltage $U_{total}$ (here: Vddq) altogether available at the pull-up and the pull-down circuits 113a, 113b, the total output impedance $R_{total}$ of the pull-up and the pull-down circuits 113a, 113b (or of the driver device 112, respectively) can be determined for the respective driver setting, e.g. in accordance with the formula $$R_{total} = U_{total}/I_{total,corr} \quad \text{(formula (2))}$$ or $$R_{total} = Vddq/I_{total,corr} \quad \text{(formula (2'))}$$

From the above-mentioned (e.g. 256 different) driver settings, now those are selected at which the total output impedance $R_{total}$ determined corresponds to a desired value of the total output impedance $R_{total,desired}$ (or, more exactly, e.g. those driver settings at which the total output impedance $R_{total}$ determined deviates at most by a predetermined, low percentage or absolute amount from the desired total output impedance $R_{total,desired}$ or a predetermined number of driver settings at which the total output impedance $R_{total}$ determined is closest to the desired total output impedance $R_{total,desired}$).

The desired total output impedance $R_{total,desired}$ may be determined from the respective values for the (desired) pull-up circuit output impedance $R_{Pull-Up,desired}$ and the (desired)

pull-down circuit output impedance $R_{Pull-Down,desired}$ and corresponds in particular to the sum of these two output impedance desired values (i.e. $R_{total,desired} = R_{Pull-Up,desired} + R_{Pull-Down,desired}$).

The pull-down circuit output impedance $R_{Pull-Down,desired}$ (that is desired or is to be set) should have the same value as the pull-up circuit output impedance $R_{Pull-Up,desired}$ (that is desired or is to be set), so that the following applies: $R_{total,desired} = 2 \times R_{Pull-Up,desired}$ or $R_{total,desired} = 2 \times R_{Pull-Down,desired}$.

The desired value for $R_{Pull-Up,desired}$ and $R_{Pull-Down,desired}$ may, for instance—correspondingly identical to the impedance of the respective signal line—be 45 OHM, and, accordingly, the desired value for $R_{total,desired}$ may e.g. be 90 OHM.

In a next step—for the above-mentioned, selected driver settings, in particular for those driver settings at which the total output impedance $R_{total}$ determined corresponds to the desired value for the total output impedance $R_{total,desired}$—the voltage $U_{Output}$ available at the output pad 115c is measured—with simultaneously activated or switched-on, respectively, pull-up and pull-down circuits 113a, 113b, as described above—(namely in that the voltage available between the contact needle 9b—that contacts the output pad 115c—and the contact needles 111d, 111e, 111f—that contact the ground connection 115b (or, alternatively, the contact needles 111a, 111b, 111c that contact the supply voltage pad 115b)—is measured by the testing apparatus 4, i.e. directly the voltage $U_{Output}$ (or, alternatively, the voltage $Vddq - U_{Output}$)).

Subsequently—for the above-mentioned, selected driver settings, in particular for those driver settings at which the total output impedance $R_{total}$ determined corresponds to the desired value of the total output impedance $R_{total,desired}$—that driver setting is selected at which the voltage $U_{Output}$ at the output pad 115c measured in the above-mentioned way is as close as possible to a respectively desired output voltage desired value $U_{desired}$.

This output voltage desired value $U_{desired}$ should lie as exactly as possible between the desired voltage level of a "logically high" output signal—output later on during regular operation—(here: a level of e.g. 1.8 V), and the desired output level of a "logically low" output signal—output later on during regular operation—(here: a level of 0 V) (e.g. 0.9 V).

This ensures that $R_{Pull-Up}$ is as great as $R_{Pull-Down}$ (and thus $R_{Pull-Up}$ is as great as $R_{Pull-Up,desired}$ and $R_{Pull-Down}$ is as great as $R_{Pull-Down,desired}$).

It is not absolutely necessary to measure the current for all the 256 different settings, as described above. Conceivable alternatives are e.g.:

The measurements (current and subsequently voltage) are first of all only performed for "typical" settings (e.g. the pull-up settings 7 to 10 and the pull-down settings 9 to 13). Only if the target values are not found here, other settings will also be used;

First of all, the "symmetrical" settings are determined, i.e. those settings at which pull-up and pull-down are equally strong. Example: The pull-down setting 1 is activated, and then (via a voltage measurement at the pad) the pertinent pull-up setting is determined. Subsequently, the pull-down setting 2 is activated, and (via a voltage measurement at the pad) the pertinent pull-up setting is searched, etc. Subsequently, that setting is selected among those 16 settings at which the total current over pull-up and pull-down exactly corresponds to the desired (double) output impedance.

The above-described driver setting selection methods may—in a corresponding way—be performed e.g. for all driver devices provided with the semiconductor device 3b (i.e. each individual driver device of the semiconductor device 3b may be calibrated individually).

Alternatively, the driver setting determined in the above-mentioned way for a particular driver device 112 may (without further, separate measurements being performed) be taken over for several, in particular for all, further driver devices provided on the semiconductor device 3b.

In a further alternative, no driver device 112 actually used for the driving of signals (later on, during regular operation of the semiconductor device 3b) is used for adjusting the driver settings, but a test driver device—merely used for selecting the driver setting in accordance with the above-explained method—is used, the structure of which is identical to that illustrated in FIG. 3 (the driver setting determined by means of this test driver device may then be used correspondingly for all driver devices provided on the semiconductor device 3b and actually used during regular operation).

A test driver device of this kind need not necessarily comprise an output pad corresponding to the output pad 115c as provided with the driver device 112 illustrated in FIG. 3, but may also be designed without such an output pad (or not be connected with such a pad, respectively).

Instead of measuring—as described above—the voltage $U_{Output}$ at a corresponding output pad 115c, the voltage $U_{internal}$—corresponding to this voltage—may then be measured over the pull-up or pull-down circuit, respectively, e.g. by a device provided on the semiconductor device itself (e.g. an appropriate on-chip voltage comparator).

Since, in all of the above-mentioned methods, the corresponding voltage ($U_{Output}$ or $U_{internal}$, respectively) is measured current-free (or almost current-free), the measuring result is not (or only slightly) influenced by a—possibly uncontrollably high—dirtying e.g. of the contact needle 9b. Therefore, by means of the above-described methods, it is possible to set the output impedance of the respective driver devices 112 with higher accuracy than is the case in prior art.

The invention claimed is:

1. A method for measuring and trimming the impedance of a driver device in a semiconductor device during a test being carried out before the regular operation of the semiconductor device, the driver device of the semiconductor device including each a pull-up circuit and a pull-down circuit, the method comprising:

substantially simultaneously activating both the pull-up circuit and the pull-down circuit; and determining a first current flowing through the pull-up circuit or the pull-down circuit, respectively, with substantially simultaneously activated pull-up and pull down circuits during the test carried out before the regular operation of the semiconductor device.

2. A method for measuring and trimming the impedance of a driver device in a semiconductor device during a test being carried out before the regular operation of the semiconductor device, the driver device of the semiconductor device including each a pull-up circuit and a pull-down circuit, the method comprising:

joint activating both the pull-up circuit and the pull-down circuit; and determining a first current flowing through the pull-up circuit or the pull-down circuit, respectively, with jointly activated pull-up and pull down circuits during the test carried out before the regular operation of the semiconductor device; wherein the pull-up or pull-down circuits, respectively, are connected to a supply voltage pad or a ground connection, respectively, of the semiconductor device, and the method further comprising:

joint de-activating both the pull-up circuit and the pull-down circuit; and determining a standby current flowing between the supply voltage pad and the ground connection with jointly de-activated pull-up and pull down circuits.

3. The method according to claim 2, wherein the pull-up or pull-down circuits, respectively, are connected to a voltage supply pad or a ground connection, respectively, of the semiconductor device, and the method further comprising:

joint activating both the pull-up circuit and the pull-down circuit; and determining a total current flowing between the supply voltage pad and the ground connection with jointly activated pull-up and pull-down circuits.

4. The method according to claim 3, further comprising determining the first current by deducting the standby current from the total current.

5. The method according to claim 1, further comprising:

determining a voltage dropping over the pull-up and/or pull-down circuit, in particular with substantially simultaneously activated pull-up and pull-down circuits.

6. The method according to claim 1, further comprising:

determining a voltage dropping over the substantially simultaneously activated pull-up and pull-down circuits.

7. The method according to claim 1, wherein one or several of the method steps are performed several times in sequence, each with different settings of transistors contained in the pull-up or pull-down circuits, respectively.

8. The method according to claim 1, the method comprising:

determining a total impedance of the pull-up and pull-down circuits.

9. The method according to claim 7, wherein, on the basis of a total impedance determined or the first current determined, respectively, and a voltage dropping over the pull-up and/or pull-down circuit as determined, one of said settings is selected that is to be used during regular operation of the device.

10. The method according to claim 1, wherein the device is a driver device used for the driving of output signals during the regular operation of the semiconductor device during the test carried out before the regular operation of the semiconductor device.

11. The method according to claim 1, wherein the device is a test device not used for the driving of output signals during the regular operation of the semiconductor device, the test device for selecting the driver setting for at least one other semiconductor device during the test carried out before the regular operation of the at least one other semiconductor device.

12. The method according to claim 11, wherein the test device is connected with a device provided on the semiconductor device itself, by means of which a voltage dropping over the pull-up and/or pull-down circuit is determined.

* * * * *